United States Patent
Park

(10) Patent No.: US 6,366,611 B1
(45) Date of Patent: Apr. 2, 2002

(54) CIRCUIT FOR CONTROLLING EQUALIZATION PULSE WIDTH

(75) Inventor: San-Ha Park, Seoul (KR)

(73) Assignee: Hyundai Electronics Industries Co., Ltd, Ichon-shi (KR)

( * ) Notice: Subject to any disclaimer, the term of this patent is extended or adjusted under 35 U.S.C. 154(b) by 0 days.

(21) Appl. No.: 09/219,531

(22) Filed: Dec. 23, 1998

(30) Foreign Application Priority Data

Feb. 9, 1998 (KR) ................................. 98/3711

(51) Int. Cl.[7] .............................. H03H 7/30; H03H 7/40; H03K 5/159
(52) U.S. Cl. ...................................... 375/229; 365/233.5
(58) Field of Search ................................. 375/229, 377, 375/237, 238; 327/34, 36, 38, 172; 365/202, 203, 233, 233.5

(56) References Cited

U.S. PATENT DOCUMENTS 5,111,480 A * 5/1992 Sarkoezi
5,617,088 A * 4/1997 Yasuda ........................ 341/61
5,672,989 A * 9/1997 Jang et al. .................. 327/143
5,894,449 A * 4/1999 Jung

* cited by examiner

*Primary Examiner*—Jean Corrielus
(74) *Attorney, Agent, or Firm*—Fleshner & Kim, LLP

(57) ABSTRACT

A circuit for controlling an equalization pulse width is disclosed that enables a stable data and minimizes or reduces a speed delay. The control circuit for the equalization pulse width includes a pulse generator for forming a predetermined pulse width in accordance with a set option when address signals are transited, and an addition unit for combining pulses formed by each of the address signals. A pulse latch unit continuously latches an equalization signal in an enabled state when signals are all enabled using a signal by which a redundancy Y-selection signal is enabled when a redundancy occurs in a coding signal from a Y-predecoder.

18 Claims, 3 Drawing Sheets

EQB

NYS GLITCH

RYS GLITCH

I/O

FIG.5A  EQMB
FIG.5B  YCS (AY60 ~67)
FIG.5C  RYS
FIG.5D  A
FIG.5E  EQB
FIG.5F  RYS GLITCH
FIG.5G  NYS
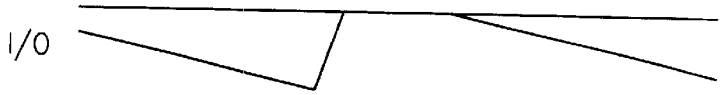
FIG.5H  I/O

CIRCUIT FOR CONTROLLING EQUALIZATION PULSE WIDTH

BACKGROUND OF THE INVENTION

1. Field of the Invention

The present invention relates to a circuit for controlling an equalization pulse width, and in particular, to a circuit for controlling an equalization pulse width that equalizes an input/output line without affecting an operational speed.

2. Background of the Related Art

A related art delay circuit 30 is used for forming an equalization pulse width using a metal option. As shown in FIG. 1, the delay circuit includes a pulse generator 10 that forms a pulse width in accordance with a set option when address signals ADD0 through ADDn are transited. An addition unit 20 receives and combines the pulses formed at each address, and an optional delay unit 30 adjusts the equalization pulse width.

The operation of the related art circuit for controlling an equalization pulse width will now be described. First, the pulse generator 10 detects the time when the address signals ADD0 through ADDn are transited and forms a predetermined pulse width based on the set option.

The addition unit 20 sums the thusly formed signals and forms one equalization pulse. The widths of the equalization pulses are adjusted using the optional delay unit 30.

As described above, the related art delay circuit has various disadvantages. The delay circuit 30 used to form a proper or desired equalization pulse width using the metal option has the pulse width determined by a repeated simulation under various simulation conditions (e.g., worst/typical/best speed). A speed delay problem occurs when expanding the pulse width to secure a predetermined operational safety timing margin. In addition, when narrowing the pulse width to increase the speed, as shown in FIGS. 2A through 2C, since a glitch does not surround the equalization signal EQ, an operational stability is decreased. In this case, a normal Y-selection signal NYS and a redundancy Y-selection signal RYS may be over-lapped, and a glitch problem may occur as shown in FIG. 2D so that a speed may be delayed and a data may be inverted because of an invalid data output.

The above references are incorporated by reference herein where appropriate for appropriate teachings of additional or alternative details, features and/or technical background.

SUMMARY OF THE INVENTION

An object of the present invention is to provide a circuit for controlling an equalization pulse width that substantially overcomes one or more of the problems caused by disadvantages in the related art.

Another object of the present invention is to provide a circuit for controlling an equalization pulse width that stabilizes data and minimizes a speed delay.

Another object of the present invention is to provide a circuit for controlling an equalization pulse width that equalizes an input/output line.

Another object of the present invention is to provide a circuit for controlling an equalization pulse width that controls an equalization pulse without reducing an operational speed when a redundancy selection signal is generated and an overlap with a normal selection signal or glitch occurs.

To achieve at least the above objects in a whole or in parts, there is provided a circuit for controlling an equalization pulse width according to the present invention that includes a pulse generator for forming a predetermined pulse width in accordance with a set option when address signals are transited, an addition unit for combining pulses formed at each address signals, and a latch unit for continuously latching an equalization signal in an enabled state when signals are all enabled using a signal by which a redundancy Y-selection signal is enabled when a redundancy occurs in a coding signal from a Y-predecoder.

To further achieve the above objects in a whole or in parts, an equalization pulse control circuit according to the present invention is provided that includes a pulse generator that detects address signal transitions and generates corresponding pulse signals in accordance with a set option, an addition unit that combines the pulse signals formed using each of the address signals to output an equalization pulse and a pulse latch unit that continuously latches an equalization signal in an enabled state when the pulse signals are all enabled using a latching signal that enables a redundant Y-selection signal when a redundancy occurs in a Y-coding signal.

To further achieve the above objects in a whole or in parts, an equalization pulse control circuit according to the present invention is provided that includes a pulse generator that generates pulse signals based on a first signal transition, a unit that combines the pulse signals to output an equalization pulse and a pulse latch unit that latches an equalization pulse state based on first and second selection signals to output an equalization signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 5A through 5H are diagrams illustrating operational timing waveforms of FIG. 3.

DETAILED DESCRIPTION OF PREFERRED EMBODIMENTS

Figure 1:
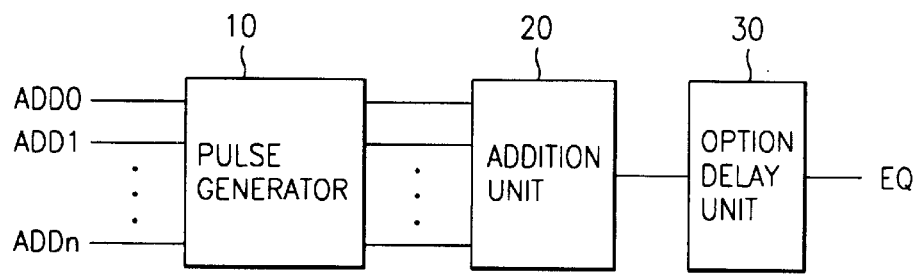
FIG. 1 is a block diagram illustrating a related art delay circuit for controlling an equalization pulse width.
Figure 2A:
FIGS. 2A through 2D are diagrams illustrating operational timing waveforms of FIG. 1.
Figure 2B:
Figure 2C:
Figure 2D:
Figure 3:
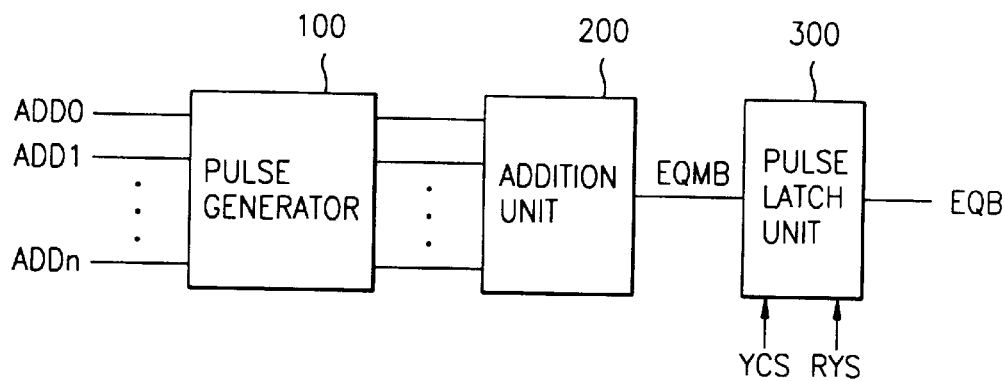
FIG. 3 is a block diagram illustrating a preferred embodiment of a circuit that controls an equalization pulse width according to the present invention.
Figure 4:
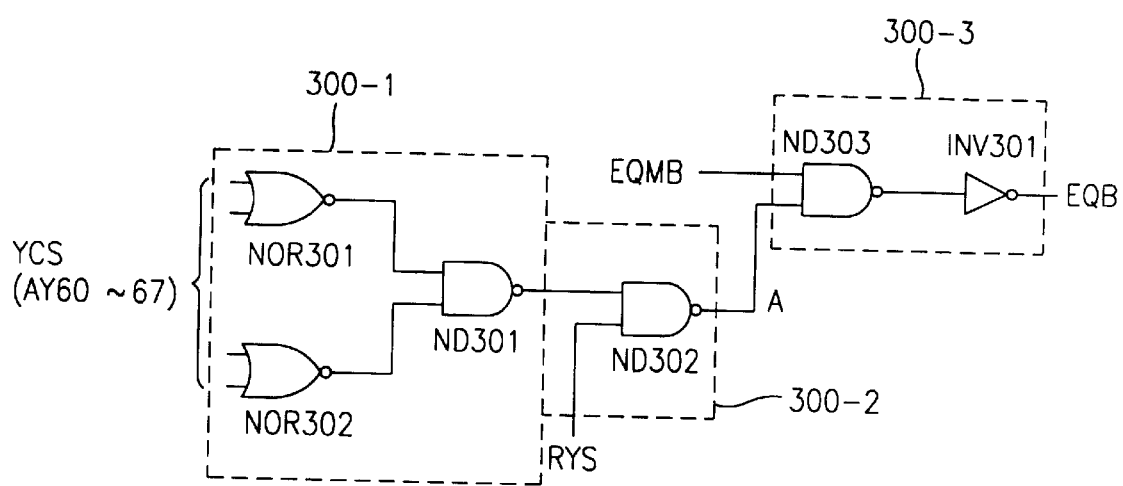
FIG. 4 is a circuit diagram illustrating an exemplary pulse latch unit of FIG. 3.

As shown in FIG. 3, a preferred embodiment of an equalization pulse width control circuit according to the present invention includes a pulse generator 100, an addition unit 200 and a pulse latch unit 300. The pulse generator 100 forms a prescribed pulse width in accordance with a set option when address signals ADD0 through ADDn are transited. The addition unit 200 receives and combines pulses formed at each address. The pulse latch unit 300 continuously latches an equalization signal EQ in an enabling state preferably when signals are all enabled using a signal by which a redundancy Y-selection signal RYS is enabled when a redundancy occurs in a coding signal YCS from a Y-predecoder.

The pulse latch unit 300 includes a first detection unit 300-1 having NOR-gates NOR301 and NOR302 for combining Y-coding signals YCS from a Y-predecoder (not shown) and a NAND-gate ND301 for NANDing output signals from the NOR-gates NOR301 and NOR302. A second detection unit 300-2 includes a NAND-gate ND302 for receiving an output signal from the first detection unit 300-1 and a Y-selection enable signal RYS. A latch unit 300-3 includes a NAND-gate ND303 for receiving an output signal A from the second detection unit 300-2 and an output signal EQMB from the addition unit 200, and an inverter INV301 for inverting an output signal from the NAND-gate ND303.

Operations of the preferred embodiment of the equalization pulse width control circuit according to the present invention will now be described. First, when the address signals ADD0 through ADDn are transited, the equalization pulse signals are enabled. The time when the thusly generated equalization pulse signal is disabled is when the normal Y-selection signal NYS and the redundancy Y-selection signal RYS are not enabled and is controlled by the pulse latch unit 300. Here, the Y-coding signal YCS from the Y-decoder and the redundancy Y-selection signal RYS from the Y-redundancy are preferably used for the equalization pulse latching operation.

As shown in FIG. 5C, when the redundancy Y-selection signal RYS is generated and the normal Y-selection glitch occurs, the latching operation is continuously performed by the pulse latch unit 300. The Y-selection glitch surrounds the equalization signal EQ to prevent a speed delay and data inversion because of an invalid data output.

When the normal Y-selection signal NYS is generated, the same effect can be obtained as when the redundancy Y-selection glitch occurs. Further, when the redundancy Y-selection signal RYS and the normal Y-selection signal NYS are over-lapped, the speed delay and the data inversion can be prevented by the same manner. In addition to overcoming the glitch or overlap problem, since the equalization pulse is disabled, stability is secured and the speed delay is reduced or minimized. Thus, the preferred embodiment of the equalization pulse width control circuit forms a proper equalization pulse width to obtain a stable operation and decrease the speed delay.

As described above, the preferred embodiment of the equalization pulse width control circuit according to the present invention has various advantages. When optimizing an equalization pulse width, since a main amplifier input signal is enabled, a high speed operation is enabled. In addition, to increase stability, when a redundancy Y-selection signal RYS is generated and normal Y-selection glitch or overlap occurs, according to the preferred embodiment the pulse latch unit 300 continuously latches the equalization pulse. In addition, since the equalization signal surrounds the normal Y-selection glitch, speed delay and data inversion caused by an unstable data output can be prevented. Further, to increase stability, when a normal Y-selection signal NYS is generated and a redundant Y-selection glitch or overlap occurs the preferred embodiment of the equalization pulse width control circuit latches the equalization pulse. In addition, after the glitch or overlap is overcome, since the equalization pulse signal is disabled, a speed delay is reduced or minimized and a stable operation is ensured. The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An equalization pulse width control circuit, comprising:
   a pulse generator that detects address signal transitions and generates corresponding pulse signals in accordance with a set option;
   an addition unit that combines the pulse signals to output an equalization pulse signal; and
   a pulse latch unit that continuously latches an equalization pulse signal using a latching signal enabled by a redundant Y-selection signal when a redundancy occurs in Y-coding signals.

2. The circuit of claim 1, wherein the equalization pulse signal is latched according to the Y-coding signals and the redundant Y-selection signal.

3. The circuit of claim 1, wherein said pulse latch unit comprises:
   a first detector that detects an enable time and disable time of the Y-coding signals;
   a second detector that detects an enable time and a disable time of the redundant Y-selection signal; and
   a latch unit that latches the equalization pulse signal using the latching signal output from the second detector.

4. The circuit of claim 3, wherein said first detector performs a detection operation using the Y-coding signals from a Y-predecoder.

5. The circuit of claim 3, wherein said first detector comprises:
   a plurality of first logic gates that logically process respective Y-coding signals; and
   a second logic gate that logically processes output signals from the plurality of first logic gates.

6. The circuit of claim 5, wherein the second detector comprises a third logic gate that logically processes an output signal from the second logic gate and the redundant Y-selection signal.

7. The circuit of claim 6, wherein the latch unit comprises:
   a fourth logic gate that logically processes an output signal of the third logic gate and the equalization pulse signal; and
   a fifth logic gate that logically processes an output signal of the fourth logic gate to output a controlled equalization pulse signal.

8. The circuit of claim 7, wherein the first logic gates are NOR-gates the second through fourth logic gates are NAND-gates and the fifth logic gate is an inverter.

9. The circuit of claim 3, wherein said second detector performs a detection operation using the redundant Y-selection signal.

10. The circuit of claim 2, wherein the pulse latch unit includes a latch unit comprising:
   a first logic circuit that logically processes the equalization pulse signal and the latching signal, which is based on the Y-coding signals and the redundant Y-selection signal; and
   a second logic unit circuit that logically processes an output signal of the first logic circuit to output a controlled equalization pulse signal.

11. An equalization pulse control circuit, comprising:
   a pulse generator that generates pulse signals based on a first signal transition;
   a unit that combines the pulse signals to output an equalization pulse signal; and
   a pulse latch unit that latches an equalization pulse signal state based on first and second selection signals to output a controlled equalization pulse signal, wherein the first selection signal is a Y-selection signal based on Y-coding signals, and wherein the second selection signal is a redundancy Y-selection signal.

12. The circuit of claim 11, wherein said pulse latch unit comprises:
   a first detector that detects an enable time and disable time of the first selection signal;
   a second detector that receives an output signal of the first detector and detects an enable time and a disable time of the second selection signal; and
   a latch unit that receives the equalization pulse signal and latches the equalization pulse signal based on an output signal from the second detector.

13. The circuit of claim 12, wherein the first signal transition is a transition of an address signal.

14. The circuit of claim 11, wherein the equalization pulse signal extends beyond a glitch in one of the Y-coding signals and the redundancy Y-selection signal.

15. An equalization pulse control circuit, comprising:
   means for generating pulse signals based on a first signal transition;
   means for combining the pulse signals to output an equalization pulse signal; and
   means for latching the equalization pulse signal based on first and second selection signals to output a controlled equalization pulse signal, wherein the first selection signal is a Y-selection signal based on Y-coding signals, and wherein the second selection signal is a redundancy Y-selection signal.

16. An equalization pulse control circuit, comprising:
   a pulse generator that generates pulse signals based on a first signal transition;
   an addition unit that combines the pulse signals to output an equalization pulse signal; and
   a pulse latch unit that latches an equalization pulse signal based on first and second selection signals to output a controlled equalization pulse signal, wherein said pulse latch unit comprises,
      a first detector that detects an enable time and disable time of the first selection signal,
      a second detector that receives an output signal of the first detector and detects an enable time and a disable time of the second selection signal, and
      a latch unit that receives the equalization pulse signal and latches the equalization pulse signal based on an output signal from the second detector.

17. The circuit of claim 16, wherein the first selection signal is a Y-selection signal based on Y-coding signals, wherein the second selection signal is a redundancy Y-selection signal, and wherein the first signal transition is a feature of an address signal.

18. The circuit of claim 17, wherein the equalization pulse signal extends beyond a glitch in one of the Y-coding signals and the redundancy Y-selection signal.

* * * * *